US010608431B2

(12) United States Patent
He et al.

(10) Patent No.: US 10,608,431 B2
(45) Date of Patent: Mar. 31, 2020

(54) SILICON CONTROLLED RECTIFIER DYNAMIC TRIGGERING AND SHUTDOWN VIA CONTROL SIGNAL AMPLIFICATION

(71) Applicant: ANALOG DEVICES, INC., Norwood, MA (US)

(72) Inventors: Linfeng He, Orlando, FL (US); Javier Alejandro Salcedo, North Billerica, MA (US); Srivatsan Parthasarathy, Acton, MA (US)

(73) Assignee: Analog Devices, Inc., Norwood, MA (US)

( * ) Notice: Subject to any disclaimer, the term of this patent is extended or adjusted under 35 U.S.C. 154(b) by 336 days.

(21) Appl. No.: 15/794,394

(22) Filed: Oct. 26, 2017

(65) Prior Publication Data

US 2019/0131787 A1 May 2, 2019

(51) Int. Cl.
*H02H 9/04* (2006.01)
*H01L 27/02* (2006.01)
*H01L 23/528* (2006.01)
*H01L 29/74* (2006.01)
*G07C 5/00* (2006.01)
*H01L 29/06* (2006.01)

(52) U.S. Cl.
CPC ............... *H02H 9/046* (2013.01); *G07C 5/00* (2013.01); *H01L 23/5286* (2013.01); *H01L 27/0262* (2013.01); *H01L 29/742* (2013.01); *H01L 29/7408* (2013.01); *H01L 29/7428* (2013.01); *H01L 29/0653* (2013.01)

(58) Field of Classification Search
CPC . H02H 9/046; H01L 23/5286; H01L 27/0262; H01L 29/0653; H01L 29/7408; H01L 29/742; H01L 29/7428; G07C 5/00

USPC .......................................................... 361/56
See application file for complete search history.

(56) References Cited

U.S. PATENT DOCUMENTS

| 5,574,618 | A | 11/1996 | Croft |
| 7,285,828 | B2 | 10/2007 | Salcedo et al. |
| 7,566,914 | B2 | 7/2009 | Salcedo et al. |

(Continued)

FOREIGN PATENT DOCUMENTS

WO   WO 2017/048240 A1   3/2017

OTHER PUBLICATIONS

Extended European Search Report for Application No. 18200942.3 dated Feb. 26, 2019, in 7 pages.

(Continued)

*Primary Examiner* — Kevin J Comber
(74) *Attorney, Agent, or Firm* — Knobbe, Martens, Olson & Bear, LLP

(57) ABSTRACT

Electrical overstress protection via silicon controlled rectifier (SCR) trigger amplification control is provided. In certain configurations, an overstress protection circuit includes a control circuit for detecting presence of an overstress event between a first pad and a second pad of an interface, and a discharge circuit electrically connected between the first pad and the second pad and selectively activated by the control circuit. The interface corresponds to an electronic interface of an integrated circuit (IC), a System on a Chip (SoC), or System in-a-Package (SiP). The discharge circuit includes a first smaller SCR and a second larger SCR. In response to detecting an overstress event, the control circuit activates the smaller SCR, which in turn activates the larger SCR to provide clamping between the first pad and the second pad.

20 Claims, 11 Drawing Sheets

(56) References Cited

U.S. PATENT DOCUMENTS

| | | |
|---|---|---|
| 7,601,991 B2 | 10/2009 | Salcedo et al. |
| 7,643,258 B2 | 1/2010 | Lai et al. |
| 7,738,222 B2 | 6/2010 | Deutschmann et al. |
| 7,773,356 B2 | 8/2010 | Ryu et al. |
| 8,044,457 B2 | 10/2011 | Salcedo et al. |
| 8,222,698 B2 | 7/2012 | Salcedo et al. |
| 8,320,091 B2 | 11/2012 | Salcedo et al. |
| 8,368,116 B2 | 2/2013 | Salcedo et al. |
| 8,416,543 B2 | 4/2013 | Salcedo |
| 8,422,187 B2 | 4/2013 | Parthasarathy et al. |
| 8,432,651 B2 | 4/2013 | Salcedo et al. |
| 8,466,489 B2 | 6/2013 | Salcedo et al. |
| 8,542,470 B2 | 9/2013 | Mallikarjunaswamy |
| 8,553,380 B2 | 10/2013 | Salcedo |
| 8,564,065 B2 | 10/2013 | Donovan et al. |
| 8,592,860 B2 | 11/2013 | Salcedo et al. |
| 8,610,251 B1 | 12/2013 | Salcedo |
| 8,637,899 B2 | 1/2014 | Salcedo |
| 8,665,571 B2 | 3/2014 | Salcedo et al. |
| 8,680,620 B2 | 3/2014 | Salcedo et al. |
| 8,723,227 B2 | 5/2014 | Salcedo et al. |
| 8,760,831 B2 | 6/2014 | Abou-Khalil et al. |
| 8,796,729 B2 | 8/2014 | Clarke et al. |
| 8,860,080 B2 | 10/2014 | Salcedo |
| 8,946,822 B2 | 2/2015 | Salcedo et al. |
| 8,947,841 B2 | 2/2015 | Salcedo et al. |
| 8,958,187 B2 | 2/2015 | Parthasarathy et al. |
| 9,006,781 B2 | 4/2015 | Salcedo et al. |
| 9,088,256 B2 | 7/2015 | Cosgrave et al. |
| 9,123,540 B2 | 9/2015 | Salcedo et al. |
| 9,147,677 B2 | 9/2015 | Salcedo et al. |
| 9,171,832 B2 | 10/2015 | Salcedo et al. |
| 9,184,098 B2 | 11/2015 | Salcedo et al. |
| 9,275,991 B2 | 3/2016 | Salcedo et al. |
| 9,293,912 B2 | 3/2016 | Parthasarathy et al. |
| 9,478,608 B2 | 10/2016 | Salcedo et al. |
| 9,633,991 B2 | 4/2017 | Salman et al. |
| 9,634,482 B2 | 4/2017 | Parthasarathy et al. |
| 9,704,851 B2 | 7/2017 | De Raad et al. |
| 2003/0076636 A1 | 4/2003 | Ker et al. |
| 2009/0309129 A1 | 12/2009 | Domanski et al. |
| 2016/0204096 A1 | 7/2016 | Zhao et al. |
| 2016/0261110 A1 | 9/2016 | Ivanov et al. |
| 2016/0285255 A1 | 9/2016 | O'Donnell et al. |
| 2016/0300830 A1 | 10/2016 | Salcedo et al. |
| 2016/0300832 A1 | 10/2016 | Besse et al. |
| 2016/0336740 A1 | 11/2016 | Parthasarathy et al. |
| 2016/0336744 A1 | 11/2016 | Parthasarathy et al. |
| 2017/0243862 A1 | 8/2017 | Parthasarathy et al. |
| 2017/0250174 A1 | 8/2017 | Xiu et al. |
| 2017/0256534 A1 | 9/2017 | Parthasarathy et al. |
| 2017/0317070 A1 | 11/2017 | Salcedo et al. |
| 2017/0366002 A1 | 12/2017 | Zhao et al. |
| 2018/0026440 A1 | 1/2018 | Zhao et al. |
| 2018/0211951 A1 | 7/2018 | Luo et al. |
| 2018/0226788 A1 | 8/2018 | Salcedo et al. |
| 2019/0051646 A1 | 2/2019 | Salcedo et al. |

OTHER PUBLICATIONS

Jang et al. "MOSFET Triggering Silicon Controlled Rectifiers for Electrostatic Discharge Protection Circuits" Solid-State Electronics 45 (2001) 1799-1803.

Ker et al. "SCR-Based Transient Detection Circuit for On-Chip Protection Design Against System-Level Electrical Transient Disturbance" Microelectronics Reliability 54 (2014) 71-78.

Parthasarathy et al. "ESD Protection Clamp with Active Feedback and Mis-Trigger Immunity in 28nm CMOS Process" IEEE 2015.

Salcedo et al. "A Novel Dual-Polarity Device With Symmetrical/Asymmetrical S-Type I-V Characteristics for ESD Protection Design" IEEE Electron Device Letters, vol. 27, No. 1, Jan. 2006.

Salcedo et al. "Bidirectional Devices for Automotive-Grade Electrostatic Discharge Applications" IEEE Electron Device Letters, vol. 33, No. 6, Jun. 2012.

Salcedo et al. "Novel and Robust Silicon-Controlled Rectifier (SCR) Based Devices for On-Chip ESD Protection" IEEE Electron Device Letters, vol. 25, No. 9, Sep. 2004.

Semenov et al. "Analysis and Design of LVTSCR-Based EOS/ESD Protection Circuits for Burn-in Environment" IEEE 2005.

SILICON CONTROLLED RECTIFIER DYNAMIC TRIGGERING AND SHUTDOWN VIA CONTROL SIGNAL AMPLIFICATION

FIELD OF THE DISCLOSURE

Embodiments of the invention relate to electronic systems, and more particularly, to systems and devices for electrical overstress protection and latch-up prevention.

BACKGROUND

Certain electronic systems can be exposed to electrical overstress events, or electrical signals of short duration having rapidly changing voltage and high power. Electrical overstress events can include, for example, electrostatic discharge (ESD) events arising from the abrupt release of charge from an object or person to an electronic system.

Electrical overstress events can damage or destroy integrated circuits (ICs) by generating overvoltage conditions and high levels of power dissipation in relatively small areas of the ICs. High power dissipation can increase IC temperature, and can lead to numerous problems, such as gate oxide punch-through, junction damage, metal damage, and surface charge accumulation.

SUMMARY OF THE DISCLOSURE

Overstress protection circuits for providing protection from electrical overstress are provided. In certain implementations, a semiconductor chip includes a control circuit that activates a discharge circuit to protect the chip from damage when an overstress event is detected. To provide both fast protection speed and ability to handle large amounts of overstress, the discharge circuit includes a smaller but faster first silicon controlled rectifier (SCR) that turns on a larger but slower second SCR.

In one aspect, a semiconductor die includes a first pad, a second pad, a control circuit configured to activate at least one trigger signal in response to detecting an electrical overstress event between the first pad and the second pad, and a discharge circuit electrically connected between the first pad and the second pad and including a first SCR and a second SCR. The first SCR is configured to turn on the second SCR in response to activation of the at least one trigger signal to thereby discharge the electrical overstress event.

In another aspect, a method of electrical overstress protection is provided. The method includes detecting for presence of an electrical overstress event between a first pad and a second pad of an electronic interface, activating at least one trigger signal in response to detecting the electrical overstress event, turning on a first SCR in response to activation of the least one trigger signal, and turning on a second SCR to clamp the first pad and the second pad using the first SCR.

In another aspect, an interface for a semiconductor chip is provided. The interface includes a first interface pad, a second interface pad, a control circuit configured to detect for presence of an electrical overstress event between the first interface pad and the second interface pad, and to activate at least one trigger signal in response to detecting the electrical overstress event, and a discharge circuit. The discharge circuit includes a first SCR configured to receive the at least one trigger signal and to turn on in response to activation of the at least one trigger signal, and a second SCR electrically connected between the first interface pad and the second interface pad. The first SCR is configured to selectively turn on or turn off the second SCR based on amplifying the at least one trigger signal.

BRIEF DESCRIPTION OF THE DRAWINGS

FIG. 7A is an annotated circuit diagram of one embodiment of a discharge circuit during turn-on.

DETAILED DESCRIPTION

Figure 1A:
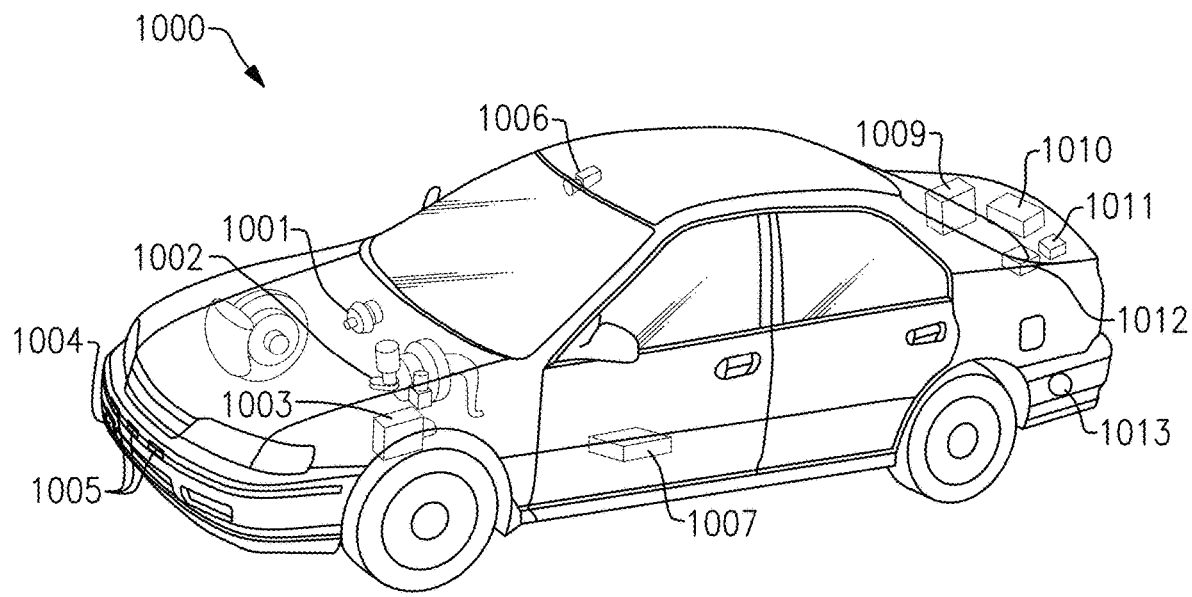
FIG. 1A is a schematic diagram of one example of a vehicle including various electronic vehicle systems that are connectable via one or more vehicle systems interfaces.

The following detailed description of certain embodiments presents various descriptions of specific embodiments of the invention. However, the invention can be embodied in a multitude of different ways as defined and covered by the claims. In this description, reference is made to the drawings where like reference numerals may indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

To help guarantee that an integrated circuit (IC) is reliable, manufacturers can test the IC under defined stress conditions, which can be described by standards set by various organizations, such as the Joint Electronic Device Engineering Council (JEDEC), the International Electrotechnical Commission (IEC), and the Automotive Engineering Council (AEC). The standards can cover a wide multitude of transient electrical overstress events, including electrostatic discharge (ESD) events. To provide protection from electrical overstress, the IC's interface can include electrical overstress protection circuits. An IC is also referred to herein as a semiconductor die or chip.

One type of overstress protection circuit is a power supply clamp, which during an overstress event provides a high current discharge path and voltage clamping between a pair of power rails, such as a supply voltage rail and a ground rail. The performance of a power supply clamp aids in meeting or exceeding specifications with respect to IC-level stress conditions and/or system-level stress conditions. Such clamps are used to not only help in minimizing electrically-induced-physical-damage arising from electrical overstress, but also in preventing unintended latch-up triggering conditions. Latch-up can be triggered, for instance, by elevated transient overvoltage between the power rails due to limitations in the ESD clamping response time of the power supply clamp. For example, electrical overstress events cause transient high current injection into an IC's substrate, which can lead to current-induced triggering of parasitic bipolar devices present in circuit layouts.

Different combination of devices and circuits can be used to implement a power supply clamp. For example, a resistor-capacitor (RC) network can serve as a detector for activating a large current handling capability device. For instance, the detector can generate a controlling signal to turn on the large current handling capability device in response to detecting transient overstress between the power rails. After activation, the large current handling capability device can provide a low-resistance current path until subsequent deactivation.

To reduce leakage, a large n-type metal oxide semiconductor (NMOS) transistor can be used as a large current handling capability device in CMOS and BCDMOS process technologies. The large NMOS transistor operates in active mode and has a gate voltage controlled by a controlling circuit. However, a large NMOS transistor can suffer from relatively low current density in active mode, which creates a desire for large transistor area utilization to compensate for the transistor's low current handling capability efficiency.

To achieve both high current handling capability and low on-state resistance, the large NMOS transistor occupies more layout area as compared to other devices that can operate in bipolar mode, for instance, a silicon controlled rectifier (SCR). Although devices that operate in bipolar mode provide high current handling capability, devices that operate in bipolar mode typically operate using a much higher driving current for control relative to large NMOS transistors. Thus, a controlling circuit may have difficulty in effectively activating and shutting down a device that operates in bipolar mode.

Apparatus and methods for electrical overstress protection are provided herein. In certain configurations, an overstress protection circuit includes a control circuit for detecting presence of an overstress event between a first pad and a second pad of an interface, and a discharge circuit electrically connected between the first pad and the second pad and selectively activated by the control circuit. In certain implementations, the first pad and the second pad correspond to a pair of power supply rails, for instance, a supply voltage rail and a ground rail, respectively. The discharge circuit includes a first or smaller SCR and a second or larger SCR. In response to detecting an overstress event, the control circuit activates the smaller SCR, which in turn activates the larger SCR to provide clamping between the first pad and the second pad.

The control circuit operates to actively control the SCR-based discharge circuit to initiate and interrupt regenerative feedback, thereby controlling turn-on and turn-off of the discharge circuit. For example, one or more trigger signals can be provided to one or more bases of a coupled pair of PNP and NPN bipolar transistors of the smaller SCR to thereby control carrier multiplication and/or recombination processes associated with regenerative feedback of the coupled pair. The smaller SCR in turn controls one or more bases of a coupled pair of PNP and NPN bipolar transistors of the larger SCR.

The smaller SCR serves to amplify the trigger signal(s) received from the control circuit, and thus can more efficiently drive the larger SCR between on and off states. Thus, implementing the discharge circuit using multiple SCRs provides more robust control over activating and shutting down the discharge circuit. Accordingly, faster turn-on time, lower voltage overshoot, and/or quicker turn-off time can be achieved while maintaining the benefits of high current handling capability provided by a bipolar mode discharge circuit.

In certain implementations, multiple SCR-based discharge circuits are distributed throughout different regions of the IC. When activated during high transient electrical overstress, the SCR-based discharge circuits assist in providing a temporary low impedance discharge path and voltage clamping function.

The teachings herein can be used in a wide variety of applications, including, but not limited to, industrial, instrumentation, energy, healthcare, automation, automotive communication, and diagnostic applications. For example, emerging mission critical applications can be specified to tolerate stress conditions that are much higher than typical overstress characterization. The overstress protection circuits herein can be used not only to provide protection during power-off conditions (for instance, during handling or ESD testing), but also during power-on conditions in which the IC receives power. For instance, certain system level applications, such as automotive interfaces, industrial LVDS drivers, satellite automotive sensors, and wired communication interface circuits, can be subject to stress conditions during normal operation.

The interface can correspond to an electronic interface of an IC, a System on a Chip (SoC), or System in-a-Package (SiP). In certain implementations, the overstress protection circuit is fabricated on a semiconductor die or chip and provides protection to circuitry fabricated on-chip with the overstress protection circuit. However, other configurations are possible. In a first example, the overstress protection circuit is fabricated on a first chip and provides protection to circuitry on a second chip, which can be in a common package or module with the first chip. In a second example, the overstress protection circuit is fabricated on a chip and provides protection to off-chip components, such as surface mount devices.

FIG. 1A is a schematic diagram of one example of a vehicle 1000 including various electronic vehicle systems that are connectable via one or more vehicle systems interfaces. In the illustrated example, the vehicle 1000 includes a throttle actuator system 1001, a steering actuator system 1002, a brake actuator system 1003, a laser range finder system 1004, a forward-looking radar system 1005, a camera system 1006, a steering sensor system 1007, a vehicle control computer system 1009, a vision computer system 1010, a drive by wire (DBW) controller system 1011, a display computer system 1012, and a side-looking radar system 1013.

The vehicle systems shown in FIG. 1A are connectable to one or more vehicle systems interfaces, such as a local interconnect network (LIN) interface, a controller area network (CAN) interface, an automotive audio bus (A2B) interface, a Fieldbus interface, and/or a wide variety of other communication interfaces or buses. The vehicle systems interfaces are used to provide communication between various vehicle systems, thereby facilitating electronic control and management of the vehicle 1000. Although one example of vehicle systems is depicted in FIG. 1A, a vehicle can include a wide range of electronic vehicle systems.

Vehicle systems interfaces can be exposed to a wide range of electrical overstress events. Such electrical overstress events can include not only ESD events, but also voltage spikes resulting from delivering a varying current to an inductive load, overstress events arising from electromagnetic inductive coupling, electrical overstress received by way of load dump from starting an automotive engine, and/or other electrical overstress events.

The overstress protection circuits herein can be used to provide protection to electronic components, such as semiconductor chips, that are exposed to electrical overstress events via an interface, such a vehicle systems interface. For example, an overstress protection circuit implemented in accordance with the teachings herein can serve as a power clamp between a supply voltage and a ground voltage received over a vehicle systems interface. Although the teachings herein can be used to provide protection to electronic circuitry of a vehicle systems interface, other applications of the technology are possible. For example, the overstress protection circuits herein can be used not only for automotive applications, but also to provide protection to chip interfaces used in industrial, instrumentation, energy, healthcare, control, diagnostic, and/or a wide range of other applications.

Figure 1B:
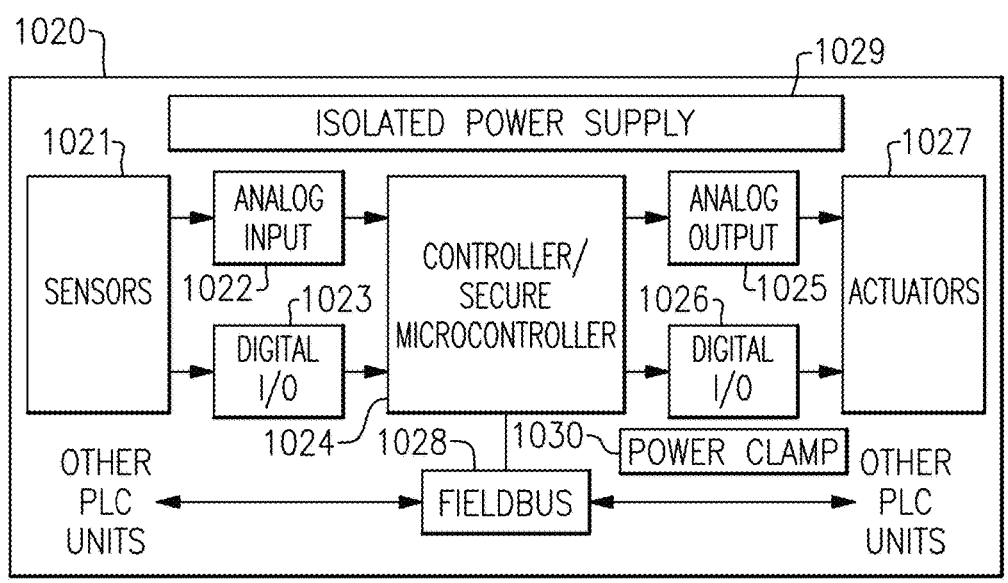
FIG. 1B is a schematic diagram of one embodiment of an integrated circuit (IC) that is connectable to a vehicle systems interface or other communication interface.

FIG. 1B is a schematic diagram of one embodiment of an integrated circuit (IC) or semiconductor die 1020 that is connectable to a vehicle systems interface or other communication interface. The semiconductor die 1020 includes sensors 1021, an analog input circuit 1022, a first digital input/output (I/O) circuit 1023, a controller (for instance, a secure microcontroller) 1024, an analog output circuit 1025, a second digital I/O circuit 1026, actuators 1027, a Fieldbus circuit 1028, an isolated power supply circuit 1029, and a power clamp 1030. The IC 1020 can be used for communication interfaces associated with distributed remote nodes including sensors and/or actuators.

In the illustrated embodiment, the IC 1020 is connectable to a Fieldbus interface or bus via the Fieldbus circuit 1028. For example, the IC 1020 can communicate with programmable logic controllers (PLCs) via the Fieldbus circuit 1028, thereby aiding in providing real-time distributed control and communication. In the illustrated embodiment, the IC 1020 includes the power clamp 1030 to provide clamping between a supply voltage and a ground voltage received via the Fieldbus interface. The power clamp 1030 can be implemented with one or more features in accordance with the teachings herein.

Although example applications for overstress protection circuits are illustrated in FIGS. 1A and 1B, the teachings herein are applicable to a wide range of applications, including, but not limited to, chip interfaces for automotive, industrial, instrumentation, energy, healthcare, automation, and/or diagnostic applications.

Figure 2A:
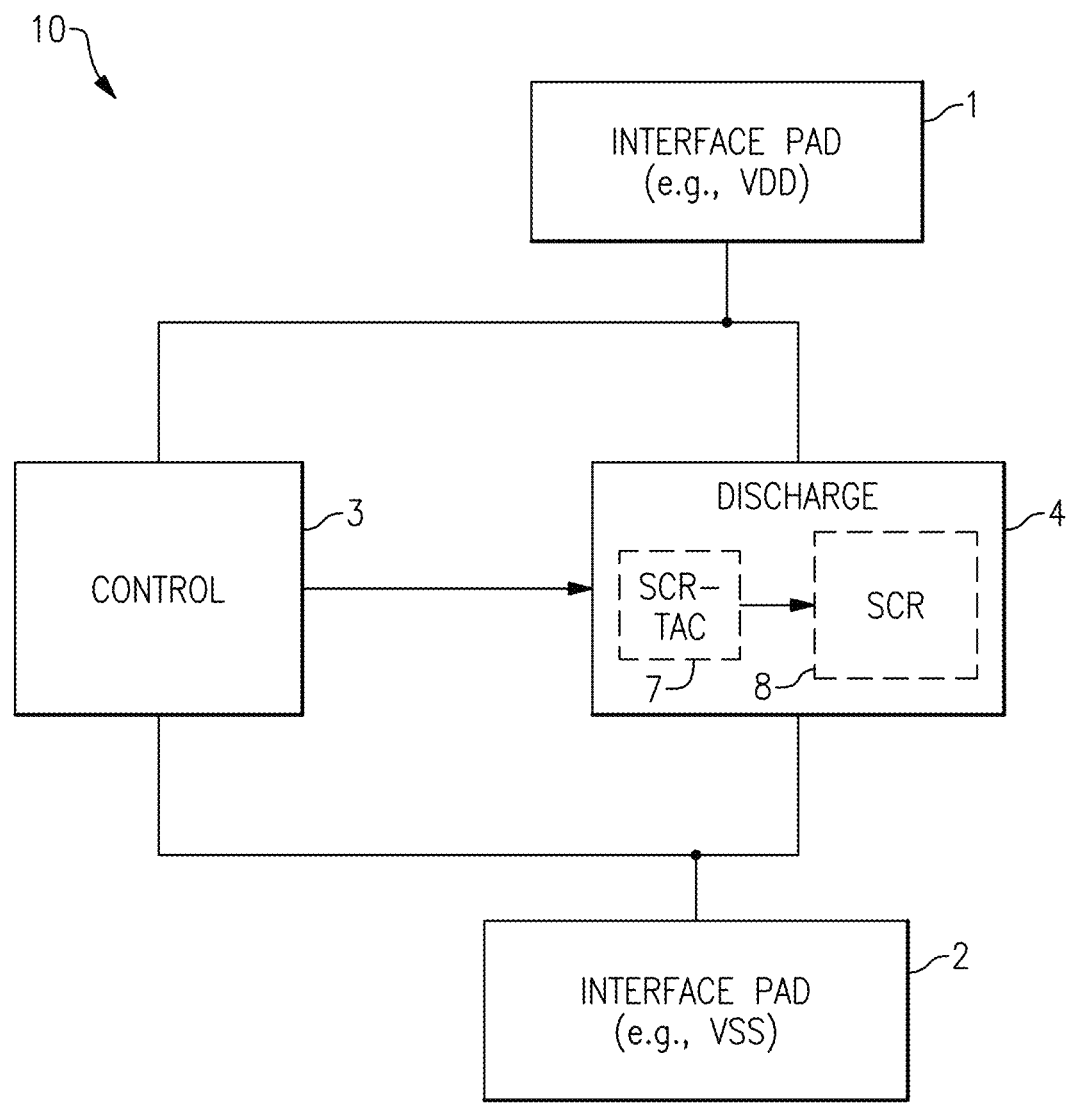
FIG. 2A is a schematic diagram of a portion of an IC interface including overstress protection according to one embodiment.

FIG. 2A is a schematic diagram of a portion of an IC interface 10 including overstress protection according to one embodiment. The IC interface 10 includes a first interface pad 1, a second interface pad 2, and an overstress protection circuit including a control circuit 3 and a discharge circuit 4.

Although not shown in FIG. 2A for clarity of the figures, the IC interface 10 can include a wide variety of additional structures and circuitry. For example, the IC interface 10 can include additional pins or pads. Furthermore, the IC interface 10 can include digital circuitry, analog circuitry, radio frequency circuitry, and/or mixed-signal circuitry that is connected to the first interface pad 1 and/or the second interface pad 2 and protected by the overstress protection circuitry shown in FIG. 2A.

The first interface pad 1 and the second interface pad 2 can correspond to a variety of types of pads. For example, an IC can include any suitable number of input pads, output pads, bidirectional pads, supply voltage pads, and/or ground pads, with one or more of these pads protected using overstress protection circuits as described herein. A pad of an IC can also be referred to herein as a pin. Furthermore, a power supply pad is also referred to herein as a power supply rail.

Although the IC interface 10 is illustrated as including one control circuit and one discharge circuit, additional control circuits and/or discharge circuits can be included. Moreover, in implementations in which an IC includes multiple power domains, overstress protection circuitry can be replicated to provide overstress protection to each power domain. For example, a control circuit can be provided for each power domain of concern, and used to control one or more associated discharge circuits.

In the illustrated embodiment, the control circuit 3 is connected between the first interface pad 1 and the second interface pad 2, and operates to turn on or off the discharge circuit 4 to selectively provide clamping. In certain implementations, the control circuit 3 monitors voltage conditions of the first interface pad 1 and the second interface pad 2 to identify a fast transient rise time associated with an electrical overstress event. In response to detection of an electrical overstress event, the control circuit 3 activates one or more trigger signals to turn on the discharge circuit 4 to clamp the first interface pad 1 and the second interface pad 2 to one another. After passage of the electrical overstress event, the control circuit 3 deactivates the trigger signal(s) to turn off the discharge circuit 4 and deactivate clamping.

As shown in FIG. 2A, the discharge circuit 4 is electrically connected between the first interface pad 1 and the second interface pad 2. The discharge circuit 4 receives trigger signal(s) from the control circuit 3 to control turn on and turn off of the discharge circuit 4. In the illustrated embodiment, the discharge circuit 4 includes a first or smaller SCR 7 and a second or larger SCR 8. An SCR is also referred to herein as a thyristor or semiconductor-controlled rectifier.

The larger SCR 8 has a larger device layout area than the smaller SCR 7 to achieve greater current handling capability. For instance, the larger SCR 8 can have a wider device width and/or a greater number of device fingers relative to the smaller SCR 7. Although the larger SCR 8 has a larger discharge current handling capability, the larger SCR 8 also operates using a higher driving current for control.

In response to detecting an electrical overstress event, the control circuit 3 activates one or more trigger signals to turn on the smaller SCR 7, which in turn activates the larger SCR 8. Thus, the control circuit 3 actively controls the smaller SCR 7 to initiate and interrupt regenerative feedback, thereby controlling turn-on and turn-off of the discharge circuit 4. For example, one or more trigger signals can be provided to one or more bases of a cross-coupled pair of PNP and NPN bipolar transistors of the smaller SCR 7, thereby controlling carrier multiplication and/or recombination processes associated with regenerative feedback of the coupled pair. The smaller SCR 7 in turn controls one or more bases of a coupled pair of PNP and NPN bipolar transistors of the larger SCR 8.

The smaller SCR 7 serves to amplify the trigger signal(s) received from the control circuit 3, and thus can more efficiently drive the larger SCR 8 between on and off states. Thus, implementing the discharge circuit 4 using multiple SCRs provides more robust control over both activation and shutdown. Accordingly, faster turn-on time, lower voltage overshoot, and/or quicker turn-off time can be achieved while maintain the benefits of high current handling capability provided by SCR clamping. The smaller SCR 7 can also be referred to herein as SCR-trigger amplification control (TAC) circuitry.

Figure 2B:
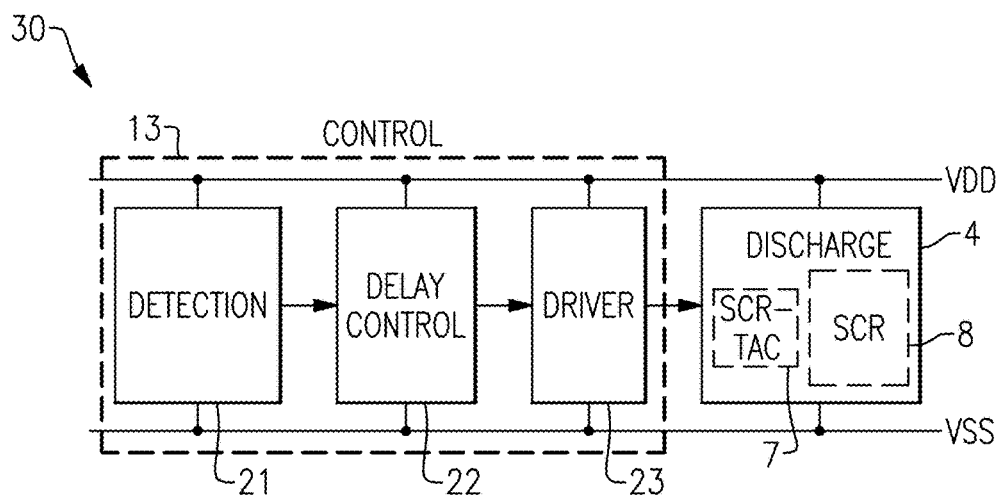
FIG. 2B is a schematic diagram of a portion of an IC interface including overstress protection according to another embodiment.

FIG. 2B is a schematic diagram of a portion of an IC interface 30 including overstress protection according to another embodiment. The IC interface 30 includes a supply voltage rail VDD, a ground rail VSS, and an overstress protection circuit including a control circuit 13 and a discharge circuit 4.

In the illustrated embodiment, the first interface pad corresponds to a supply voltage rail VDD, and the second interface pad corresponds to a ground rail VSS. However, the teachings herein can be used to provide overstress protection to other IC interface pads, including, but not limited to, pads associated with other power domains. Accordingly, other implementations are possible.

In the illustrated embodiment, the control circuit 13 includes a detection circuit 21, a delay control circuit 22, and a driver circuit 23. Although one embodiment of a control circuit is shown in FIG. 2B, the teachings herein are applicable to control circuits implemented in a wide variety of ways.

The detection circuit 21 operates to monitor for presence of electrical overstress between the supply voltage rail VDD and the ground rail VSS, and generates a detection signal indicating whether or not presence of an electrical overstress event is detected.

In certain configurations, the detection circuit 21 observes a rate of voltage change between the supply voltage rail VDD and the ground rail VSS, and controls the detection signal based on the observed rate of voltage change. However, the detection circuit 21 can detect for presence of an electrical overstress event based on a multitude of detection conditions indicative of potential damage to sensitive electronics, including, but not limited to, observations of power, voltage, current, and/or charge.

In certain implementations, the detection circuit 21 determines that an electrical overstress event is present in response to detecting a rapidly changing voltage for a sufficient period of time between the supply voltage rail VDD and the ground rail VSS. For instance, in one embodiment the detection circuit 21 activates the detection signal for transient electrical events having a rate of voltage change in the range of about 0.1 V/ns to about 100 V/ns for a length of time in the range of about 1 ns to about 1000 ns. When an electrical overstress event is not detected, the detection circuit 21 controls the detection signal DET to a signal level associated with no detection of overstress.

As shown in FIG. 2B, the detection circuit 21 provides the detection signal to the delay control circuit 22. Upon detection of an electrical overstress event, the detection circuit 21 activates the detection signal, which the delay control circuit 22 processes to generate a controlling signal. In certain implementations, the controlling signal is active while the detection signal indicates presence of overstress and for a certain amount of time thereafter. For example, the controlling signal can be activated for a time period sufficient for the discharge circuit 4 to discharge the overstress, including a trailing edge of the electrical overstress event.

The driver circuit 23 operates to buffer, invert, and/or otherwise process the controlling signal to generate at least one trigger signal for the smaller SCR 7 of the discharge circuit 4. Thus, the control circuit 13 operates to activate trigger signal(s) in response to detecting an electrical overstress event between the supply voltage rail VDD and the ground rail VSS. Additionally, after the overstress is discharged, active control terminates and the discharge circuit 4 is released.

Figure 2C:
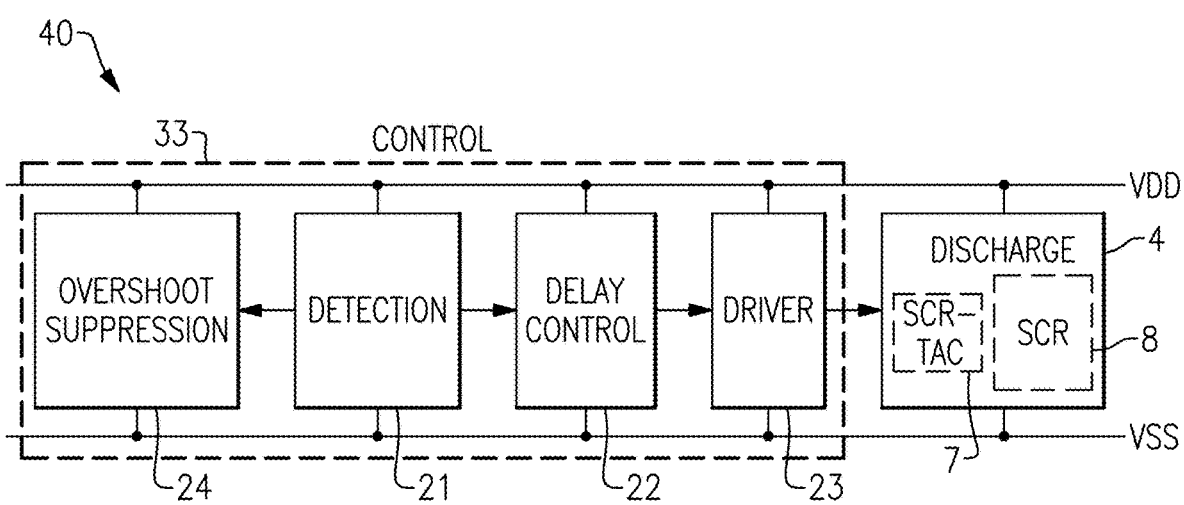
FIG. 2C is a schematic diagram of a portion of an IC interface including overstress protection according to another embodiment.

FIG. 2C is a schematic diagram of a portion of an IC interface 40 including overstress protection according to another embodiment. The IC interface 40 includes a supply voltage rail VDD, a ground rail VSS, and an overstress protection circuit including a control circuit 33 and a discharge circuit 4.

The IC interface 40 of FIG. 2C is similar to the IC interface 30 of FIG. 2B, except that the control circuit 33 of FIG. 2C further includes an overshoot suppression circuit 24.

Including the overshoot suppression circuit 24 aids in limiting or suppressing an amount of voltage overshoot that occurs before the control circuit 33 is able to activate the discharge circuit 4. For example, the discharge circuit 4 has a finite turn-on time, and thus voltage can build-up during a time period before the control circuit 33 activates the discharge circuit 4. By including the overshoot suppression circuit 24, a secondary discharge path can be activated between the supply voltage rail VDD and the ground rail VSS before a primary discharge path through the discharge circuit 4 is activated.

As shown in FIG. 2C, the detection circuit 21 provides a detection signal to the overshoot suppression circuit 24. The detection signal serves to turn on or off the overshoot suppression circuit 24 to selectively provide a secondary discharge path at the start of an overstress event to discharge a portion of the overstress and limit voltage build-up. Although FIG. 2C illustrates the detection circuit 21 as providing separate detection signals to the delay control circuit 22 and the overshoot suppression circuit 24, in certain implementations a common detection signal is provided to the delay control circuit 22 and the overshoot suppression circuit 24.

Figure 3A:
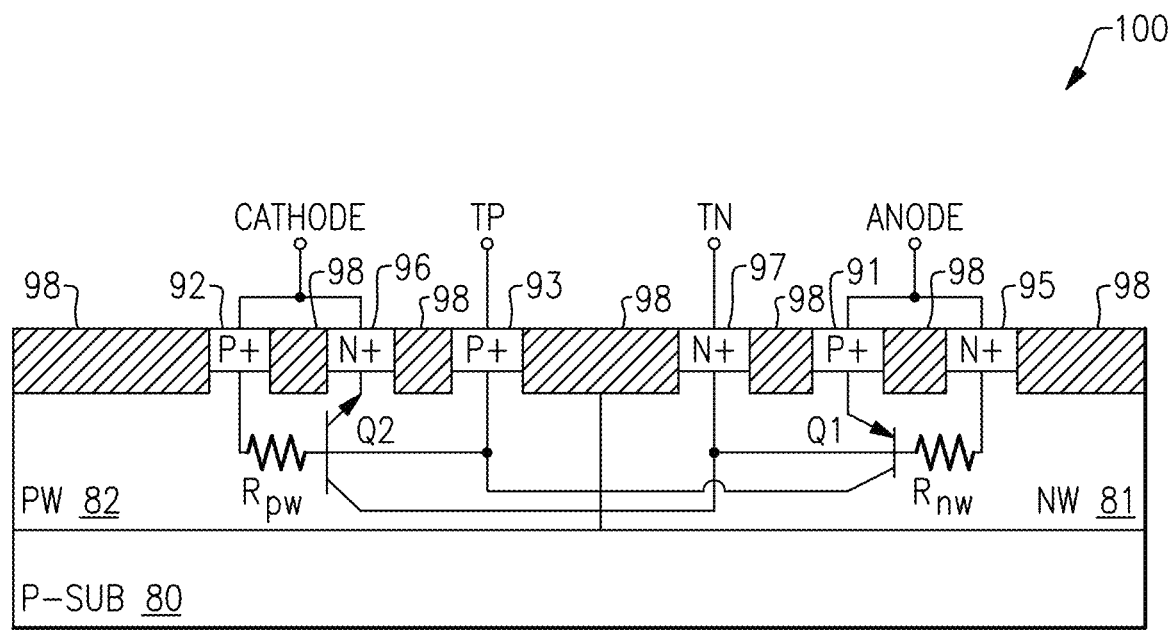
FIG. 3A is an annotated cross-section of a silicon controlled rectifier (SCR) according to one embodiment.

FIG. 3A is an annotated cross-section of an SCR 100 according to one embodiment. The SCR 100 illustrates one example implementation of an SCR that can be included in a discharge circuit. For example, one or more instantiations of the SCR 100 can be used to implement the smaller SCR 7 and/or larger SCR 8 of FIGS. 2A-2C. The SCR 100 can have a geometry (for instance, device width) selected to achieved desired current handling capability.

Although one specific implementation of an SCR is shown in FIG. 3A, the teachings herein are applicable to discharge circuits that include SCRs implemented in a wide variety of ways. In one example, an SCR can include different configurations of semiconductor wells and/or active regions.

The SCR 100 of FIG. 3A is fabricated in a p-type substrate (P-SUB) 80, and includes an n-type well (NW) 81, a p-type well (PW) 82, an anode p-type active (P+) region 91, a cathode P+ region 92, a trigger P+ region 93, an anode n-type active (N+) region 95, a cathode N+ region 96, a trigger N+ region 97, and shallow trench isolation (STI) regions 98.

As shown in FIG. 3A, the NW 81 and the PW 82 are formed in the P-SUB 80 adjacent to one another. Additionally, the anode N+ region 95, the anode P+ region 91, and the trigger N+ region 97 are formed in the NW 81, with the anode P+ region 91 positioned between the anode N+ region 95 and the trigger N+ region 97. Additionally, the anode N+ region 95 and the anode P+ region 91 are electrically connected to an anode terminal (ANODE) of the SCR 100 via metallization. Furthermore, the trigger N+ region 97 is electrically connected to a first trigger terminal (TN) via metallization. A trigger terminal is also referred to herein as a control terminal or a control input.

In the illustrated embodiment, the trigger P+ region 93, the cathode N+ region 96, and the cathode P+ region 92 are formed in the PW 82. As shown in FIG. 3A, the cathode N+ region 96 is positioned between the trigger P+ region 93 and the cathode P+ region 92. The cathode N+ region 96 and the cathode P+ region 92 are electrically connected to a cathode terminal (CATHODE) of the SCR 100 via metallization. Additionally, the trigger P+ region 93 is electrically connected to a second trigger terminal (TP) via metallization.

The electrical connections to the SCR's terminals (ANODE, CATHODE, TP, and TN) are schematically depicted in FIG. 3A, and can correspond to electrical connections made using contacts and metallization during back end processing.

Although not illustrated in FIG. 3A, the P-SUB 80 includes other devices formed therein.

The illustrated embodiment includes STI regions 98. Formation of the STI regions 98 can include etching trenches in the P-SUB 80, filling the trenches with a dielectric, such as silicon dioxide ($SiO_2$), and removing the excess dielectric using any suitable method, such as chemical-mechanical planarization.

As shown in FIG. 3A, the NW 81 and the PW 82 have a depth into the P-SUB 80 that is greater than a depth into the P-SUB 80 than both the STI regions 98 and the P+ and N+ active regions. Additionally, the STI regions 98 have a depth into the P-SUB 80 that is greater than that of the N+ and P+ regions. Furthermore, the N+ active regions have a higher n-type doping concentration than the NW 81. Additionally, the P+ active regions have a higher p-type doping concentration than the PW 82, which in turn has a higher doping concentration than the P-SUB 80.

The SCR 100 has been further annotated to show certain circuit devices present in the cross-section, including a PNP bipolar device Q1, an NPN bipolar device Q2, an NW resistor $R_{nw}$ and a PW resistor $R_{pw}$.

The PNP bipolar device Q1 includes an emitter formed from the anode P+ region 91, a base formed from the NW 81, and a collector formed from the PW 82. The NPN bipolar device Q2 includes an emitter formed from the cathode N+ region 96, a base formed from the PW 82, and a collector formed from the NW 81. The NW resistor $R_{nw}$ is formed from a resistance of the NW 81 between the collector of the NPN bipolar transistor Q2 and the anode terminal. Additionally, the PW resistor $R_{pw}$ is formed from a resistance of the PW 82 between the collector of the PNP bipolar transistor Q1 and the cathode terminal.

The first trigger terminal (TN) and/or the second trigger terminal (TP) can receive a trigger signal for activating the SCR 100. The trigger signal(s) can be provided by a control circuit, such as any of the control circuits of FIG. 2A, 2B, 2C, or 5.

During normal operating conditions when no electrical overstress event is present, the control circuit controls the trigger signal(s) to turn off the SCR 100. However, when the control circuit detects an electrical overstress event, the control circuit turns on the SCR 100 to clamp the anode terminal and the cathode terminal to reduce overvoltage conditions. After the overstress is discharged, the trigger signal(s) are deactivated to turn off the SCR 100.

In the illustrated embodiment, the trigger N+ region 97 and the trigger P+ region 93 are located in a central region of the SCR 100, and between the active regions associated with the SCR's anode and cathode terminals.

By providing trigger control at the center of the SCR 100, reduced input resistance to the base terminals of the NPN and PNP bipolar transistors is provided, thereby contributing to rapid SCR turn on time. Moreover, triggering is provided in a region of the SCR 100 in which carrier multiplication and/or recombination processes associated with regenerative feedback of the coupled PNP bipolar transistor Q1 and NPN bipolar transistor Q2 occurs. Thus, low-resistance trigger control at the center of the SCR 100 facilitates activation and deactivation of SCR conduction in a region in which regenerative feedback takes place, with a relatively small impact on SCR on-state resistance.

Figure 3B:
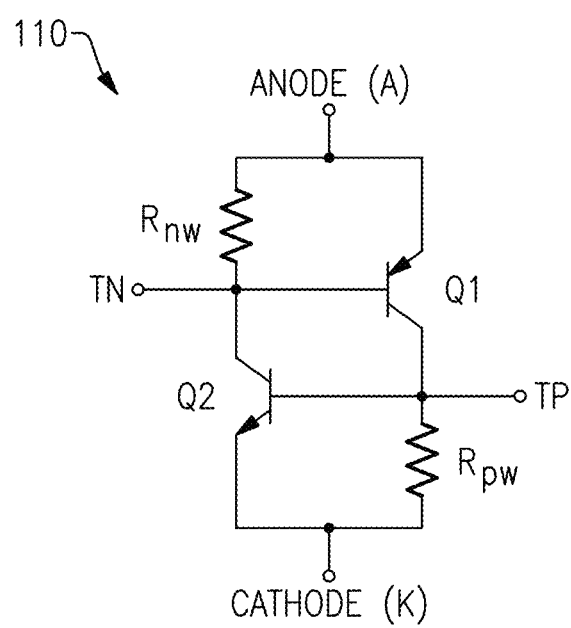
FIG. 3B is a circuit diagram of the SCR of FIG. 3A.

FIG. 3B is a circuit diagram 110 of the SCR 100 of FIG. 3A. The circuit diagram 110 includes the PNP bipolar device Q1, the NPN bipolar device Q2, the NW resistor $R_{nw}$, and the PW resistor $R_{pw}$.

As shown in FIG. 3B, the emitter of the PNP bipolar transistor Q1 is electrically connected to the anode terminal, and the collector of the PNP bipolar transistor Q1 is electrically connected to the cathode terminal via the PW resistor $R_{pw}$. Additionally, the base of the PNP bipolar transistor Q1 is electrically connected to the collector of the NPN bipolar transistor Q2. Furthermore, the first trigger terminal TN is electrically connected to the base of the PNP bipolar transistor Q1.

The emitter of the NPN bipolar transistor Q2 is electrically connected to the cathode terminal, and the collector of the NPN bipolar transistor Q2 is electrically connected to the anode terminal via the NW resistor $R_{nw}$. Additionally, the base of the NPN bipolar transistor Q2 is electrically connected to the collector of the PNP bipolar transistor Q1. Furthermore, the second trigger terminal TP is electrically connected to the base of the NPN bipolar transistor Q2.

Figure 4A:
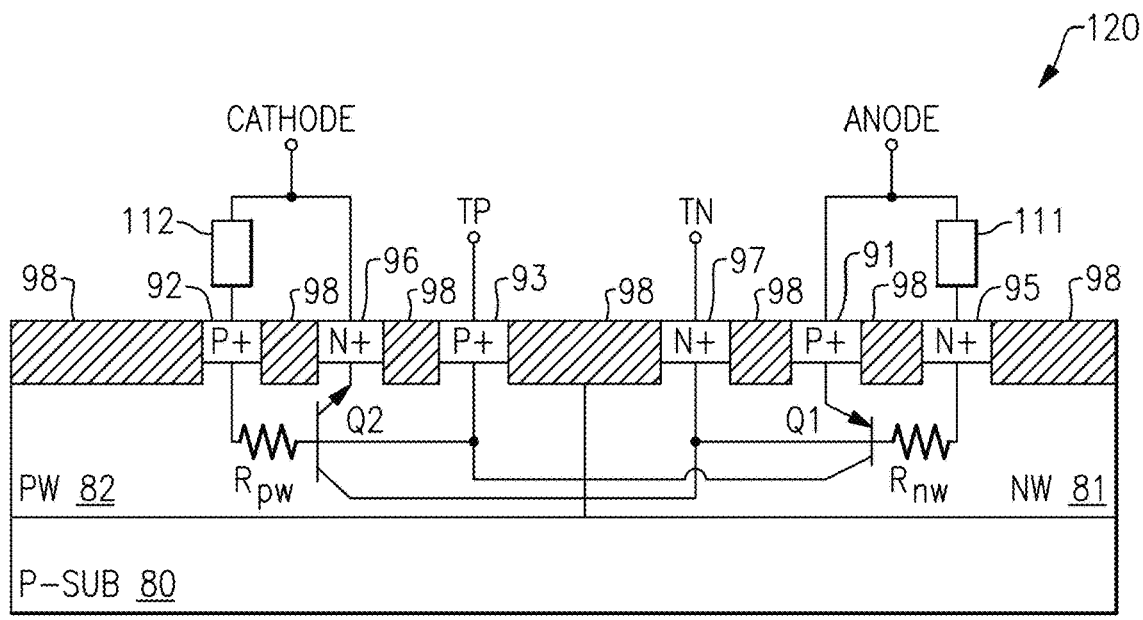
FIG. 4A is an annotated cross-section of an SCR according to another embodiment.

FIG. 4A is an annotated cross-section of an SCR 120 according to another embodiment. The SCR 120 of FIG. 4A is similar to the SCR 100 of FIG. 3A, except that the SCR 120 of FIG. 4A further includes a first SCR-characteristic adjustment circuit 111 and a second SCR-characteristic adjustment circuit 112. As shown in FIG. 4A, the first SCR-characteristic adjustment circuit 111 is connected between the anode terminal and the anode N+ region 95, and the second SCR-characteristic adjustment circuit 112 is connected between the cathode terminal and the cathode P+ region 92.

Including the first SCR-characteristic adjustment circuit 111 and/or the second SCR-characteristic adjustment circuit 112 can aid in providing control over various characteristics of the SCR 120, such as the SCR's trigger voltage. For example, as the impedance of the first SCR-characteristic adjustment circuit 111 is increased, the NPN bipolar transistor Q1 operates with a breakdown voltage collector-emitter open (BVCEO) characteristic, which can lower the SCR's trigger voltage but also increase off-state leakage current.

Thus, the first SCR-characteristic adjustment circuit 111 and/or the second SCR-characteristic adjustment circuit 112 can be included to provide fine-tuned controlled over various parameters or characteristics of the SCR 120, thereby providing performance adjustment suitable for a particular implementation and/or application.

An SCR-characteristic adjustment circuit can be implemented in a wide variety of ways, including, for example, using passive and/or active circuit components. In certain implementations, all or part of an SCR-characteristic adjustment circuit is implemented in a portion of the P-SUB 80, for instance, adjacent to a layout of the SCR's bipolar transistors.

Although FIG. 4A illustrates an embodiment including both the first SCR-characteristic adjustment circuit 111 and the second SCR-characteristic adjustment circuit 112, the teachings herein are also applicable to implementations including the first SCR-characteristic adjustment circuit 111 and omitting the second SCR-characteristic adjustment circuit 112, and to implementations including the second SCR-characteristic adjustment circuit 112 and omitting the first SCR-characteristic adjustment circuit 111.

Figure 4B:
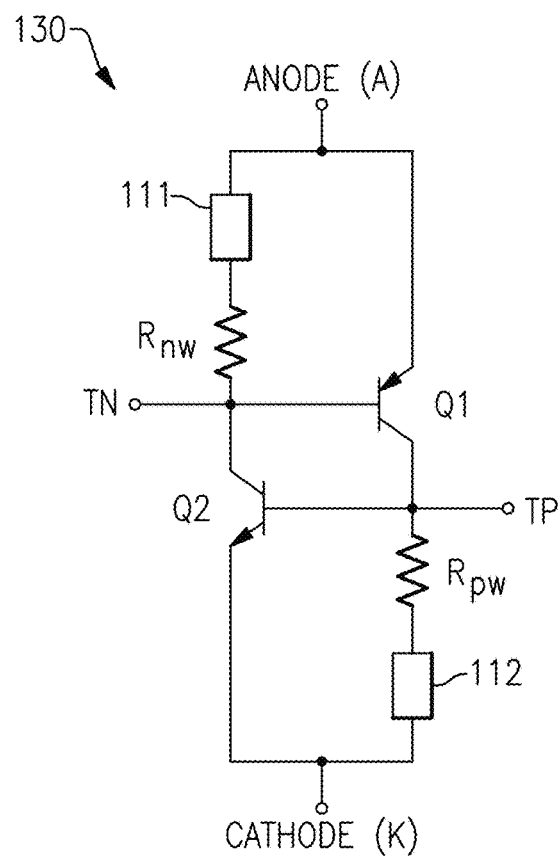
FIG. 4B is a circuit diagram of the SCR of FIG. 4A.

FIG. 4B is a circuit diagram 130 of the SCR 120 of FIG. 4A. The circuit diagram 130 of FIG. 4B is similar to the circuit diagram 110 of FIG. 3B, except that the first SCR-characteristic adjustment circuit 111 and the second SCR-characteristic adjustment circuit 112 are included. As shown in FIG. 4B, the first SCR-characteristic adjustment circuit 111 is connected between the NW resistor $R_{nw}$ and the anode terminal, and the second SCR-characteristic adjustment circuit 112 is connected between the PW resistor $R_{pw}$ and the cathode terminal.

Figure 5:
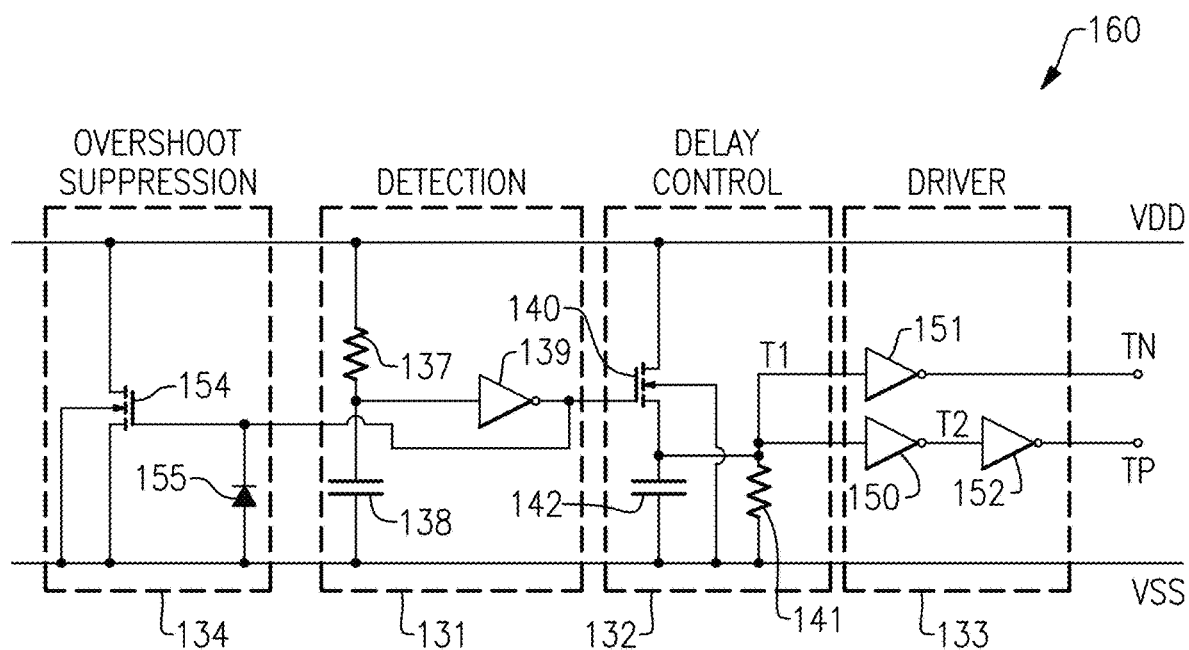
FIG. 5 is a circuit diagram of another embodiment of a control circuit for controlling activation and shutdown of a discharge circuit.

FIG. 5 is a circuit diagram of another embodiment of a control circuit 160 for controlling activation and shutdown of a discharge circuit. The control circuit 160 is electrically connected between a supply voltage rail VDD and a ground rail VSS, and includes a detection circuit 131, a delay control circuit 132, a driver circuit 133, and an overshoot suppression circuit 134.

Although one specific implementation of a control circuit is shown, a control circuit can be implemented in a wide variety of ways. For example, a control circuit can include components and/or sub-circuits implemented in a wide variety of ways to meet performance specifications associated with a particular implementation and/or application.

The detection circuit 131 includes a detection resistor 137 and a detection capacitor 138 electrically connected in series between the supply voltage rail VDD and the ground rail VSS. Additionally, the detection circuit 131 includes a detection inverter 139 including an input connected to a node between the detection resistor 137 and the detection capacitor 138, and an output that generates a detection signal indicating whether or not an overstress event has been detected. In this example, a logically high value of the detection signal indicates that overstress is present. In another implementation, a logically low value of the detection signal is used to indicate presence of overstress.

During normal operating conditions on the supply voltage rail VDD and the ground rail VSS, the detection signal generated by the detection inverter 139 is logically low. However, when a voltage difference between the supply voltage rail VDD and the ground rail VSS increases relatively quickly, the voltage drop across the detection resistor 137 turns on a PMOS transistor of the detection inverter 139, thereby controlling the detection signal to a logically high value. The resistance of the detection resistor 137 and the capacitance of the detection capacitor 138 can be sized to activate in response to a transient signal associated with overstress (for instance, an ESD event), while not falsely activating in response to chip power-on and/or normal operating conditions associated with slow transient voltage change (dV/dt) between the power rails.

The delay control circuit 132 includes an NMOS transistor 140, a delay control resistor 141, and a delay control capacitor 142. The NMOS transistor 140 includes a gate that receives the detection signal from the detection circuit 131. When the detection signal is logically high, the NMOS transistor 140 turns on and charges the delay control capacitor 142. After the detection signal falls to a logically low value, the delay control capacitor 142 discharges via the delay control resistor 141. The asymmetric resistance values used for charging (a resistance of NMOS transistor 140) and discharging (a resistance of the delay control resistor 141) allow for sample and holding of the logic control level. Thus, the first controlling signal T1 can be kept logic high for a desired time period (for instance, a few hundred nanoseconds) by selection of a resistor-capacitor (RC) time constant associated with the delay control resistor 141 and the delay control capacitor 142.

The driver circuit 160 includes an inverter 150, a first driver 151, and a second driver 152. The first driver 151 inverts the first controlling signal T1 to generate a first trigger signal TN. Additionally, the inverter 150 inverts the first controlling signal T1 to generate a second controlling signal T2, which is inverted by the second driver 152 to generate a second trigger signal TP.

The first trigger signal TN and/or the second trigger signal TP can be used to control activation of a discharge circuit.

The driver circuit 160 also includes an overshoot suppression circuit 134 for mitigating voltage overshoot associated with finite activation time of the discharge circuit controlled by the driver circuit 160. The overshoot suppression circuit 134 includes an NMOS transistor 154 connected between the supply voltage rail VDD and the ground rail VSS, and selectively activated by the detection signal from the detection circuit 131. The overshoot suppression circuit 134 operates to limit voltage overshoot between the supply voltage rail VDD and the ground rail VSS before the primary discharge circuit is turned on by the trigger signals TN and/or TP.

The overshoot protection circuit 134 also includes the diode 155, which serves to protect the NMOS transistor 154 from damage by limiting the transistor's gate-to-source voltage.

Figure 6A:
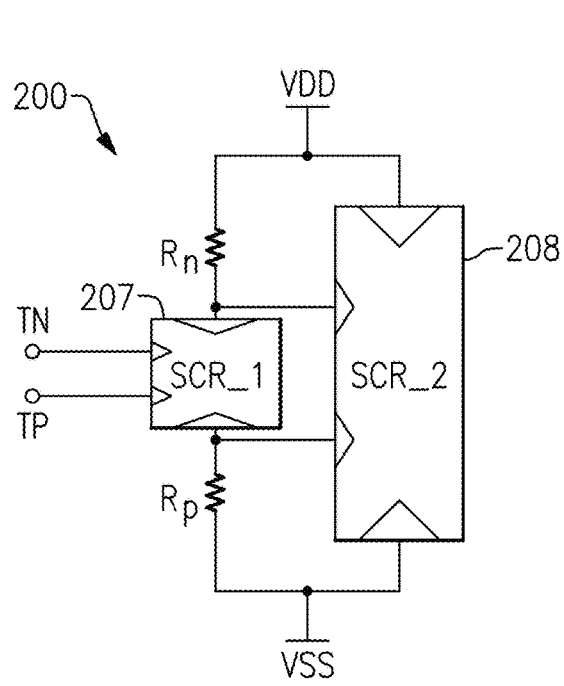
FIG. 6A is a circuit diagram of one embodiment of a discharge circuit.

FIG. 6A is a circuit diagram of one embodiment of a discharge circuit 200. The discharge circuit 200 includes a smaller SCR 207 and a larger SCR 208. The smaller SCR 207 and/or the larger SCR 208 can be implemented in a wide variety of ways, including, but not limited to, using the SCR configurations shown in FIGS. 3A and/or 4A with appropriately selected geometries. However, the smaller SCR 207 and/or the larger SCR 208 can be implemented in other ways.

As shown in FIG. 6A, the smaller SCR 207 includes a first trigger terminal that receives a first trigger signal TN and a second trigger terminal that receives a second trigger signal TP. The first trigger signal TN and the second trigger signal TP can be generated in a wide variety of ways, including, but not limited to, using the discharge circuit 160 of FIG. 5. Although the illustrated embodiment illustrates a configuration in which two trigger signals are used, the teachings herein are also applicable to implementations using more or fewer trigger signals.

The smaller SCR 207 also includes an anode terminal connected to a first trigger terminal of the larger SCR 208, and to the supply voltage rail VDD via an anode resistor $R_n$. The small SCR 207 further includes a cathode terminal connected to a second trigger terminal of the larger SCR 208, and to the ground rail VSS via a cathode resistor $R_p$. As shown in FIG. 6A, the larger SCR 208 includes an anode terminal connected to the supply voltage rail VDD, and a cathode terminal connected to the ground rail VSS.

In the illustrated embodiment, the anode resistor $R_n$ and the cathode resistor $R_p$ are explicit resistors provided in addition to parasitic well resistances of the SCRs 207, 208. In one embodiment, the anode resistor $R_n$ and the cathode resistor $R_p$ are implemented as diffusion resistors. In another embodiment, the anode resistor $R_n$ and the cathode resistor $R_p$ are implemented as thin film resistors and/or polysilicon resistors with high current handling capability. In certain implementations, a diffusing resistor is implemented with substrate isolation to avoid breakdown between the supply voltage rail VDD and substrate.

The smaller SCR 207 serves to amplify the trigger signals TN and TP, thereby expediting turn-on time of the larger SCR 208. Accordingly, the benefits of both fast turn-on time and high on-state current handling capability can be achieved.

Figure 6B:
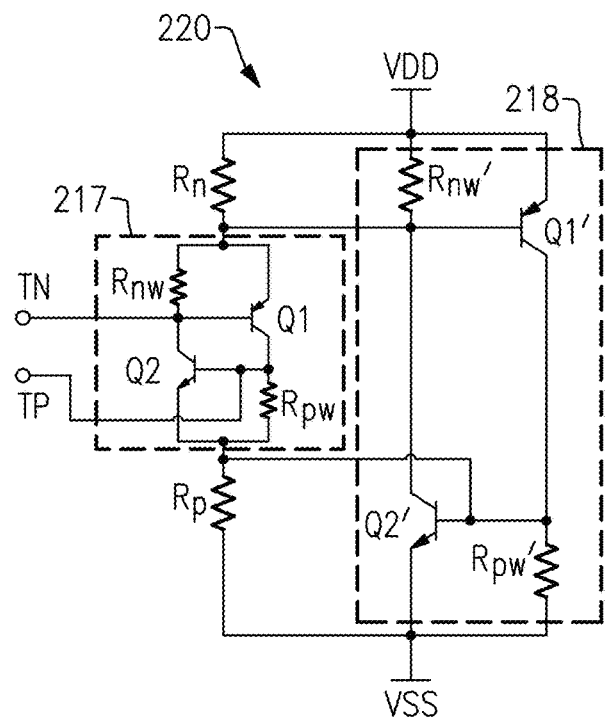
FIG. 6B is a circuit diagram of another embodiment of a discharge circuit.

FIG. 6B is a circuit diagram of another embodiment of a discharge circuit 220. The discharge circuit 220 of FIG. 6B is similar to the discharge circuit 200 of FIG. 6A, except that the discharge circuit 220 illustrates a specific implementation in which the smaller SCR 217 and the larger SCR 218 are each implemented with an instantiation of the SCR of FIGS. 3A and 3B. To achieve different size between the smaller SCR 217 and the larger SCR 218, the SCRs are implemented with different device areas, such as different device widths and/or number of device fingers.

As shown in FIG. 6B, the smaller SCR 217 includes a PNP bipolar transistor Q1, an NPN bipolar transistor Q2, an NW resistor $R_{nw}$ and a PW resistor $R_{pw}$. Additionally, the larger SCR 218 includes a PNP bipolar transistor Q1', an NPN bipolar transistor Q2', an NW resistor $R_{nw}'$, and a PW resistor $R_{pw}'$.

Figure 6C:
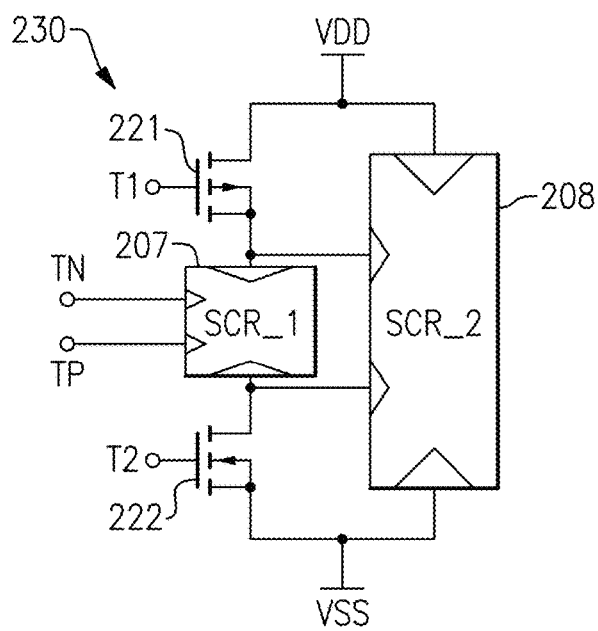
FIG. 6C is a circuit diagram of another embodiment of a discharge circuit.

FIG. 6C is a circuit diagram of another embodiment of a discharge circuit 230. The discharge circuit 230 of FIG. 6C is similar to the discharge circuit 200 of FIG. 6A, except that the discharge circuit 230 of FIG. 6C illustrates an implementation in which the anode resistor $R_n$ and the cathode resistor $R_p$ are omitted in favor of including a PMOS transistor 221 and an NMOS transistor 222, respectively. As shown in FIG. 6C, the PMOS transistor 221 has a gate controlled by a first controlling signal T1, which can be generated, for example, using the control circuit 160 of FIG. 5. Additionally, the NMOS transistor 222 has a gate controlled by a second controlling signal T2, which can be generated, for example, using the control circuit 160 of FIG. 5.

In certain embodiments, the first SCR 207 is connected to the supply voltage rail VDD and/or the ground rail VSS using both resistors and transistors. In a first example, a resistor and a transistor (in parallel or series) are included between the anode of the first SCR and the supply voltage rail VDD and/or between the cathode of the first SCR and the ground rail VSS. In a second example, a resistor is included between the anode of the first SCR and the supply voltage rail VDD and a transistor is included between the cathode of the second SCR and the ground rail VSS. In a third example, a transistor is included between the anode of the first SCR and the supply voltage rail VDD and a resistor is included between the cathode of the second SCR and the ground rail VSS.

Figure 7A:
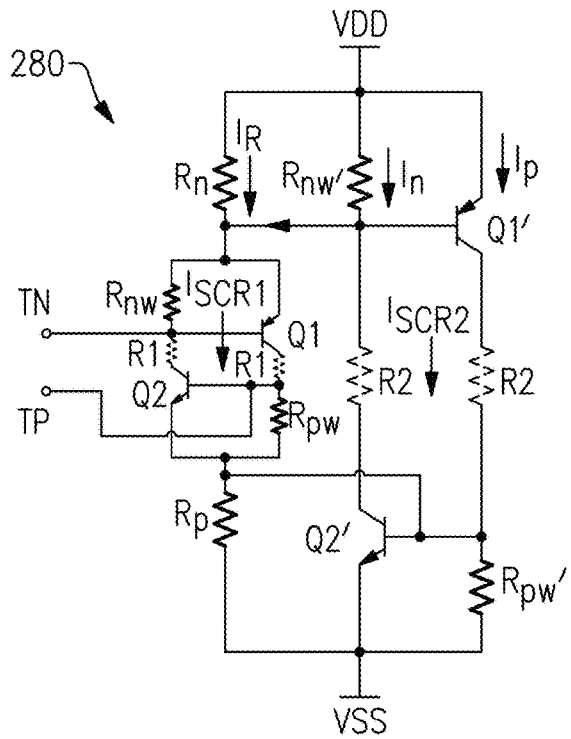
Figure 7B:
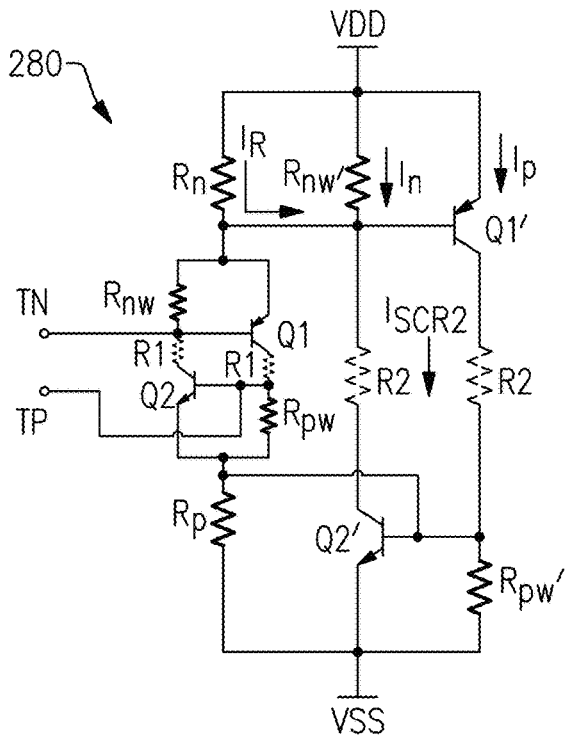
FIG. 7B is an annotated circuit diagram of one embodiment of a discharge circuit during turn-off.
Figure 7C:
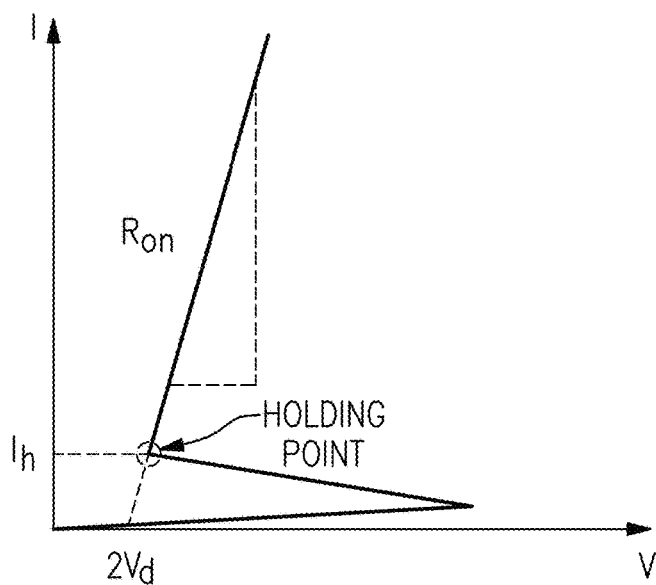
FIG. 7C is one example of a graph of voltage versus current for an SCR.

FIG. 7A is an annotated circuit diagram of one embodiment of a discharge circuit 280 during turn-on. FIG. 7B is an annotated circuit diagram of one embodiment of a discharge circuit 280 during turn-off. FIG. 7C is one example of a graph of voltage versus current for an SCR.

The discharge circuit 280 of FIGS. 7A and 7B is similar to the discharge circuit 220 of FIG. 6B, except that the discharge circuit 280 has been illustrated with various annotations describing one example of turn-on and turn-off operation.

With reference to FIG. 7A, NPN bipolar transistor Q1 and resistor $R_n$ operate as a first emitter follower, and PNP bipolar transistor Q2 and resistor $R_n$ operate as a second emitter follower. The first and second emitter followers operate to amplify current of the first trigger signal TN and the second trigger signal TP, respectively. The amplified output currents from the emitter followers operate to turn on NPN bipolar transistor Q1' and PNP bipolar transistor Q2' associated with the larger SCR.

The parameters for the SCR devices can be selected in a wide variety of ways. Directions of currents for turn-on are annotated in FIG. 7A. During turn-on, the smaller SCR can conduct before the larger SCR.

In one embodiment, during turn-on, the current $I_n$ through NW resistor $R_{nw}'$ flows into the smaller SCR, since initially $I_p$ and $I_{SCR2}$ currents are close to zero because the larger SCR has not yet turned on. Once the larger SCR starts to turn on, the voltage drops on both resistor $R_n$ and NW resistor $R_{nw}'$ are roughly the forward bias of a p-n junction (for instance, $V_d$ or about 0.6V-0.8V). Under such conditions, the current $I_{SCR1}$ through the smaller SCR can be given by Equation 1 below.

$$I_{SCR1} = \frac{V_d}{R_n // R_{nw}} \qquad \text{Equation 1}$$

In certain implementations, Equation 1 is constrained by Equation 2 below, in which $I_{t2,SCR1}$ and $I_{h,SCR1}$ are the smaller SCR's failure current and holding current, respectively.

$$I_{t2,SCR1} > I_{SCR1} > I_{h,SCR1} \qquad \text{Equation 2}$$

In one embodiment, the variables of Equation 2 are replaced using normalized (to width) values, yielding Equation 3 below. In Equation 3, $A_1$ and $A_2$ represent the widths of the smaller SCR and the larger SCR, respectively. Additionally, $\widehat{I_h}$, $\widehat{I_{t2}}$ and $\widehat{R_{nw}}$ values can be obtained from testing or simulation of one or more SCRs.

$$A_1 \widehat{I_{t2}} > V_d \left( \frac{1}{R_n} + \frac{A_2}{\widehat{R_{nw}}} \right) > A_1 \widehat{I_h} \qquad \text{Equation 3}$$

In one embodiment, once the current exceeds the holding current $I_h$, the voltage increases linearly with current. In such an implementation, the slope is defined by on resistance $R_{on}$, and for specified current $I_{SCR}$, the voltage drop is given by Equation 4 below.

$$V_{SCR} = 2V_d + I_{SCR} R_{on} \qquad \text{Equation 4}$$

In one embodiment, the smaller SCR has an on-state resistance R1 and the larger SCR has an on-state resistance of R2. With respect to the turn-off process shown in FIG. 7B, the current through $R_n$ and $R_{nw}$ can be given by Equation 5 below, where $I_{h,SCR2}$ is the holding current of the larger SCR.

$$I_R + I_n = \frac{V_d}{R_n // R_{nw}} \leq I_{h,SCR2} \qquad \text{Equation 5}$$

In one embodiment, the larger SCR is implemented such that at holding point, the voltage $V_{DD}$ between power rail and ground rail is given by Equation 6 below. Implementing the overstress protection circuit in this manner aids in mitigating latch-up risks.

$$2V_d + I_{h,SCR2} R2 < V_{DD} \qquad \text{Equation 6}$$

In one embodiment, Equation 1 is combined with Equation 6 to yield Equation 7 below.

$$2V_d + \frac{V_d}{R_n // R_{nw}} R2 > V_{DD} \qquad \text{Equation 7}$$

In certain implementations, one or more of the Equations provided above are used to obtain values for $A_1$, $A_2$, and/or $R_n$.

Figure 8:
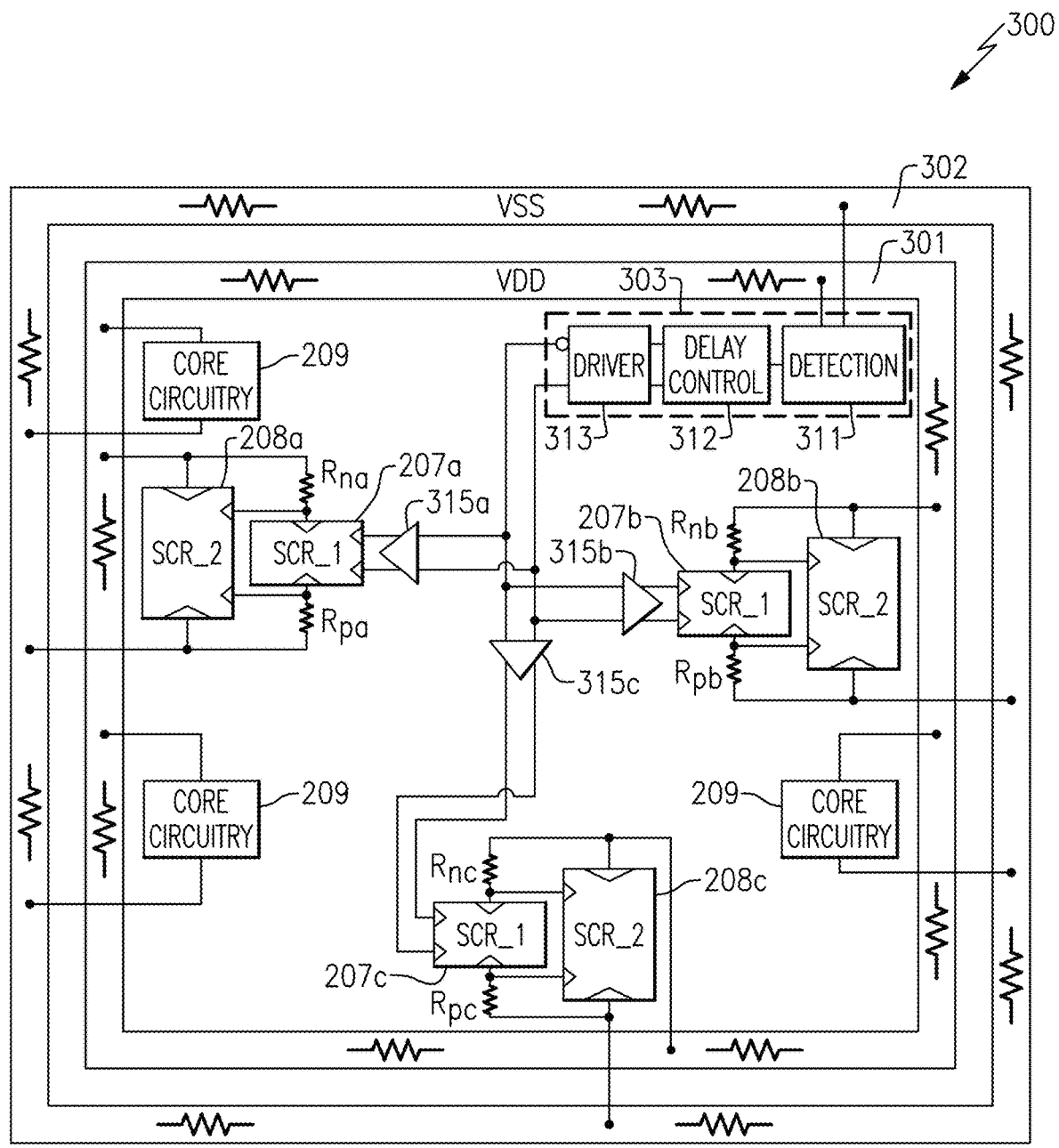
FIG. 8 is a schematic diagram of one embodiment of an IC implemented with overstress protection.

FIG. 8 is a schematic diagram of one embodiment of an IC 300 implemented with overstress protection. The IC 300 includes a first conductor 301, a second conductor 302, core circuitry 209, and overstress protection circuitry including a control circuit 303, first to third trigger distribution circuits 315a-315c, first to third smaller SCRs 207a-207c, first to third larger SCRs 208a-208c, first to third anode resistors $R_{na}$, $R_{nb}$, $R_{nc}$, and first to third cathode resistors $R_{pa}$, $R_{pb}$, $R_{pc}$.

Although one specific embodiment of an IC 300 is shown in FIG. 8, the teachings herein are applicable to ICs implemented in a wide variety of ways, including, but not limited to, ICs implemented with more or fewer control circuits and/or discharge circuits. Furthermore, ICs can include different configurations of circuitry protected by an overstress protection circuit. Accordingly, although FIG. 8 illustrates one specific implementation of an IC, other IC implementations are possible.

With reference to FIG. 8, the first conductor 301 carries a supply voltage VDD received from one or more supply voltage pads (not shown in FIG. 8), and the second conductor 301 carries a ground voltage VSS received from one or more ground pads (not shown in FIG. 8). However, the teachings here can be used to provide overstress protection to other power domains. Accordingly, other implementations are possible.

In the illustrated embodiment, the first conductor 301 and the second conductor 302 are schematically depicted as rings for providing power supply distribution about the IC 300, including to core circuitry 209. The core circuitry 209 can include a wide variety of circuitry, such as digital circuitry, analog circuitry, radio frequency circuitry, and/or mixed-signal circuitry. Although the conductors are illustrated as rings, supply distribution conductors can be implemented in a wide variety of ways. Moreover, a conductive network for distributing a power supply can include conductors on multiple metallization layers of an IC. In FIG. 9, the conductors are depicted as including parasitic resistors.

With continuing reference to FIG. 8, the control circuit 303 includes a detection circuit 311 that generates a detection signal based on monitoring a voltage difference between the first conductor 301 and the second conductor 302. Additionally, the control circuit 303 includes a delay control circuit 312 for generating a controlling signal based on the detection signal. Furthermore, the control circuit 303 further includes a driver circuit 313 which generates a first trigger signal and a second trigger signal based on the controlling signal. The first and second trigger signals are provided to the trigger distribution circuits 315a-315c, which serve to distribute the triggers signals to the smaller SCRs 207a-207c. The smaller SCRs 207a-207c in turn controls selective activation of the larger SCRs 208a-208c, respectively.

In the illustrated embodiment, multiple discharge circuits are provided. Including multiple discharge circuits can aid in limiting overvoltage across different regions of the IC 300. For example, resistive and/or inductive effects associated with conductors used for power supply distribution can lead to voltage drops and different electrical potentials at different positions along the conductors.

Figure 9A:
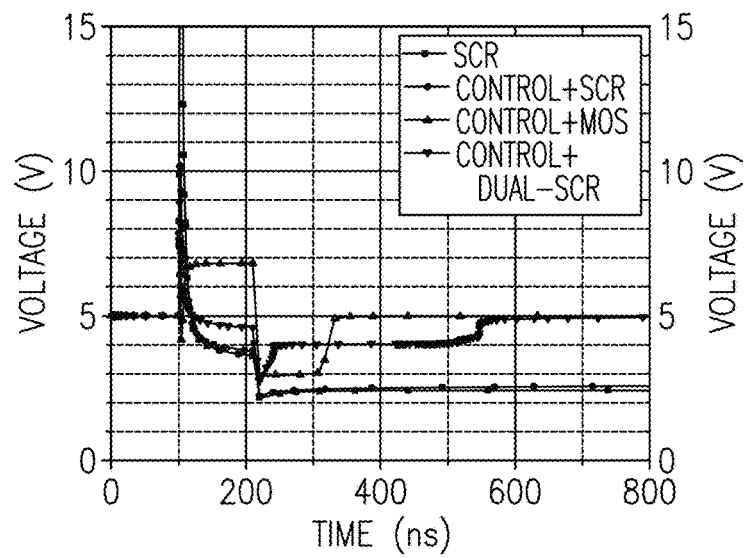
FIG. 9A is one example of simulated waveforms of voltage versus time for various overstress protection circuits.
Figure 9B:
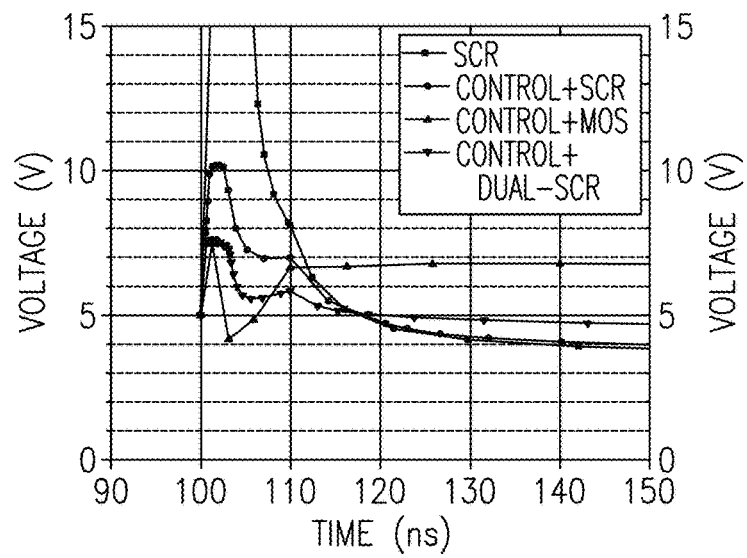
FIG. 9B is another example of simulated waveforms of voltage versus time for various overstress protection circuits.
Figure 9C:
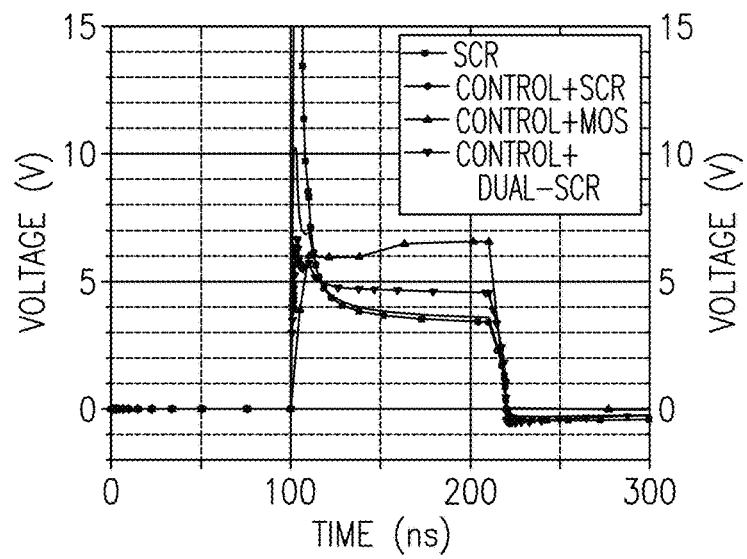
FIG. 9C is another example of simulated waveforms of voltage versus time for various overstress protection circuits.

FIGS. 9A-9C illustrate various examples of simulated waveforms for various overstress protection circuits. The results correspond to data generated using mixed-mode simulation using Synopsys Sentaurus. Four types of overstress protection circuits are simulated. In particular, each figure includes a first plot ("SCR") of a single SCR providing protection without using a control circuit, a second plot ("Control+SCR") of a single SCR controlled by a control circuit, a third plot ("Control+MOS") of a single NMOS transistor with a width of 1200 μm controlled by a control circuit, and a fourth plot ("Control+Dual-SCR") of an overstress protection circuit using one implementation of the discharge circuit 200 of FIG. 6A and the control circuit 160 of FIG. 5.

FIG. 9A is one example of simulated waveforms of voltage versus time for the overstress protection circuits described above for an IC in a power-on state. FIG. 9B is another example of simulated waveforms of voltage versus time for the overstress protection circuits described above for an IC in a power-on state. FIGS. 9A and 9B correspond to the same simulation, but with different time scales.

The power-on state simulation emulates overstress when the IC is biased and fully operational. In this simulation, VDD is initially set to 5V. At 100 ns, a 1 amp transmission line pulse (TLP) with 10 ns rising time and 100 ns pulse width is applied to VDD. The pulse simulates one example of an electrical overstress event. As shown in FIGS. 9A and 9B, the single SCR has the highest overshoot voltage. Additionally, the single SCR undesirably remains in a latch-up condition after the pulse is removed at about 220 ns.

For the case of a control circuit and single SCR, turn-on speed is improved relative to a stand-alone SCR, but the clamping voltage is still higher than 10V. After the TLP pulse ends, the control circuit is unable to turn-off the SCR, and the SCR undesirably remains in a latch-up condition.

For the case of a control circuit controlling a big NMOS transistor, the overshoot is improved. Additionally, the NMOS transistor can be turned-off by the control circuit, as shown by the voltage of VDD eventually recovering to 5V. However, the big NMOS transistor has a relatively high on-resistance, as shown by the clamping voltage approaching 7V at 1A.

As shown in FIGS. 9A and 9B, the control circuit and dual-SCR has a comparable overshoot voltage to the control circuit and NMOS transistor, and advantageously handles more stress current with a smaller circuit layout. The dual-SCR can be turned off by the control circuit, eliminating latch-up concerns.

FIG. 9C is another example of simulated waveforms of voltage versus time for the overstress protection circuits described above for an IC in a power-off state. For the power-off state, the IC's power supplies are powered-down. In this simulation, the initial voltage on VDD is 0 volts. At 100 ns, a 1 amp TLP pulse with 10 ns rising time and 100 ns pulse width is applied. Although not visible in the plot of FIG. 9C, the overshoot voltage of the single SCR is relative high, for instance, up to about 40 V higher than that of the control circuit and dual-SCR.

As shown in FIG. 9C, the control circuit fails to turn on the single SCR effectively. Although the control circuit and large NMOS transistor shows low voltage overshoot, on-resistance of the NMOS is relatively high, resulting in a clamping voltage of about −6V.

With continuing reference to FIG. 9C, the control circuit and dual-SCR provides a similar transient performance as the control circuit and large NMOS transistor, but provides a superior clamping voltage (corresponding to lower on-state resistance) and occupies a smaller layout area.

Figure 10A:
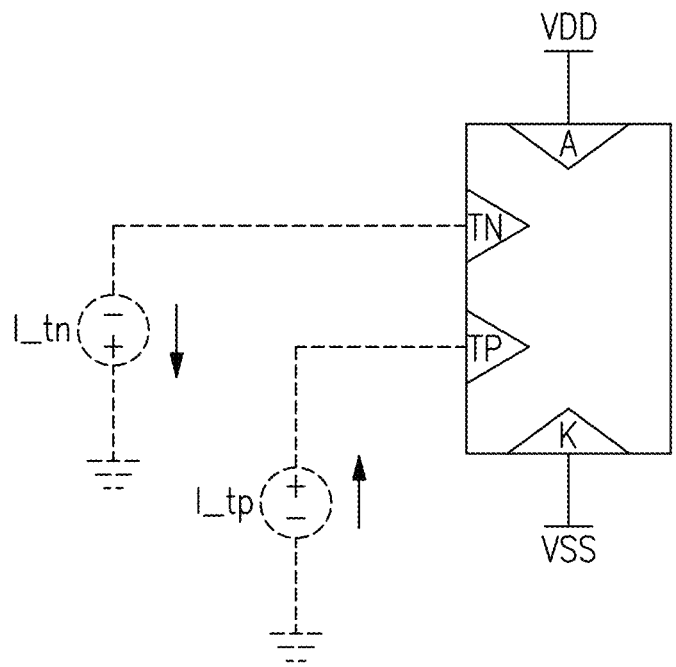
FIG. 10A is a schematic diagram of a simulation setup for an SCR.

FIG. 10A is a schematic diagram of a simulation setup for an SCR. As shown in FIG. 10A, a first current source I_tn and a second current source I_tp drive a first trigger terminal TN and a second trigger terminal TP, respectively, of an SCR.

Figure 10B:
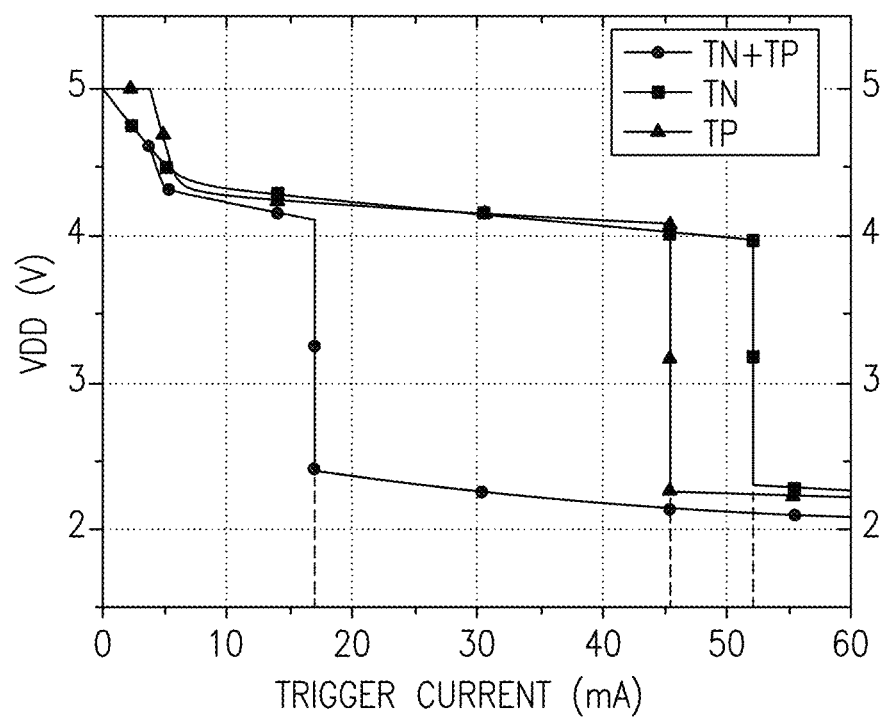
FIG. 10B is one example of simulated trigger current versus voltage for the simulation setup of FIG. 10A.

FIG. 10B is one example of simulated trigger current versus voltage for the simulation setup of FIG. 10A. As shown in FIG. 10B, using both a first trigger signal to control the first trigger terminal TN and a second trigger terminal TP reduces an amount of trigger current to activate the SCR. Thus, using multiple trigger signals enhances performance relative to implementations using a single trigger signal. Although using multiple trigger signals can enhance performance, the teachings herein are also applicable to implementations using one trigger signal.

Although one example of simulation results are shown in FIGS. 9A-10B, simulation results can vary based on a wide range of factors, such as circuit implementation, simulation parameters, models, and/or tools. Accordingly, other waveforms are possible.

Devices employing the above-described schemes can be implemented into various electronic devices. Examples of the electronic devices can include, but are not limited to, consumer electronic products, parts of the consumer electronic products, electronic test equipment, communication infrastructure applications, etc. Further, the electronic device can include unfinished products, including those for communication, industrial, medical and automotive applications.

Terms such as above, below, over and so on refer to a device orientated as shown in the figures and should be construed accordingly. It should also be appreciated that because regions within a semiconductor device are defined by doping different parts of a semiconductor material with differing impurities or differing concentrations of impurities, discrete physical boundaries between different regions may not actually exist in the completed device but instead regions may transition from one to another. Some boundaries of this type and are illustrated as abrupt structures merely for the assistance of the reader. As persons having ordinary skill in the art will appreciate, p-type regions can include a p-type semiconductor material, such as boron, as a dopant. Furthermore, n-type regions can include an n-type semiconductor material, such as phosphorous, as a dopant. Persons having ordinary skill in the art will appreciate various concentrations of dopants in regions described above.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. A semiconductor die comprising:
    a first pad;
    a second pad;
    a control circuit configured to activate at least one trigger signal in response to detecting an electrical overstress event between the first pad and the second pad; and
    a discharge circuit electrically connected between the first pad and the second pad and comprising a first silicon controlled rectifier (SCR) and a second SCR, wherein the first SCR is configured to turn on the second SCR in response to activation of the at least one trigger signal to thereby discharge the electrical overstress event,
    wherein an anode of the first SCR is electrically connected to a first control input of the second SCR, and a cathode of the first SCR is electrically connected to a second control input of the second SCR.

2. The semiconductor die of claim 1, wherein the second SCR has a larger device area than the first SCR.

3. The semiconductor die of claim 2, wherein the second SCR is implemented with a larger device width or a larger number of device fingers than the first SCR.

4. The semiconductor die of claim 2, wherein the at least one trigger signal comprises a pair of trigger signals received by the first SCR.

5. The semiconductor die of claim 1, wherein the first SCR comprises an NPN bipolar transistor and a PNP bipolar transistor that are cross-coupled, wherein the at least one trigger signal comprises at least one of a first trigger signal provided to a base of the NPN bipolar transistor or a second trigger signal provided to a base of the PNP bipolar transistor.

6. The semiconductor die of claim 1, further comprising at least one of a first resistor or a first field-effect transistor (FET) electrically connected between the anode of the first SCR and the first pad, and at least one of a second resistor or a second FET electrically connected between the cathode of the first SCR and the second pad.

7. The semiconductor die of claim 1, wherein the first pad comprises a power supply rail and the second pad comprises a ground rail.

8. The semiconductor die of claim 1, wherein the control circuit comprises:
 a detection circuit configured to activate a detection signal in response to detecting presence of the electrical overstress event;
 a delay control circuit configured to generate a controlling signal based on the detection signal, the controlling signal being active for a longer duration than the detection signal; and
 a driver circuit configured to generate the at least one trigger signal based on the controlling signal.

9. The semiconductor die of claim 8, wherein the control circuit further comprises an overshoot protection circuit electrically connected between the first pad and the second pad, wherein the detection circuit is further configured to turn on the overshoot protection circuit in response to detecting presence of the electrical overstress event.

10. A method of electrical overstress protection, the method comprising:
 detecting for presence of an electrical overstress event between a first pad and a second pad of an electronic interface;
 activating at least one trigger signal in response to detecting the electrical overstress event;
 turning on a first silicon controlled rectifier (SCR) in response to activation of the least one trigger signal;
 turning on a second SCR to clamp the first pad and the second pad using the first SCR;
 amplifying a first trigger signal of the at least one trigger signal using a PNP bipolar transistor of the first SCR; and amplifying a second trigger signal of the at least one trigger signal using an NPN bipolar transistor of the first SCR.

11. The method of claim 10, wherein detecting for presence of the electrical overstress event comprises activating a detection signal in response to detecting the electrical overstress event, generating a controlling signal based on the detection signal, the controlling signal being active for a longer duration than the detection signal, and buffering the controlling signal to generate the at least one trigger signal.

12. The method of claim 11, further comprising turning on an overshoot protection circuit electrically connected between the first pad and the second pad in response to detecting presence of the electrical overstress event.

13. The method of claim 10, further comprising limiting voltage overshoot by activating a secondary discharge path between the first pad and the second pad through an overshoot protection circuit before activating a primary discharge path through the second SCR.

14. An interface for a semiconductor chip, the interface comprising:
 a first interface pad;
 a second interface pad;
 a control circuit configured to detect for presence of an electrical overstress event between the first interface pad and the second interface pad, and to activate at least one trigger signal in response to detecting the electrical overstress event; and
 a discharge circuit comprising:
  a first silicon controlled rectifier (SCR) configured to receive the at least one trigger signal and to turn on in response to activation of the at least one trigger signal; and
  a second SCR electrically connected between the first interface pad and the second interface pad,
  wherein the first SCR is configured to selectively turn on or turn off the second SCR based on amplifying the at least one trigger signal, and
 wherein an anode of the first SCR is electrically connected to a first control input of the second SCR, and a cathode of the first SCR is electrically connected to a second control input of the second SCR.

15. The interface of claim 14, wherein the second SCR has a larger device area than the first SCR.

16. The interface of claim 14, wherein the first SCR comprises an NPN bipolar transistor and a PNP bipolar transistor that are cross-coupled, wherein the at least one trigger signal comprises at least one of a first trigger signal provided to a base of the NPN bipolar transistor or a second trigger signal provided to a base of the PNP bipolar transistor.

17. The interface of claim 14, further comprising a first resistor electrically connected between the anode of the first SCR and the first interface pad, and a second resistor electrically connected between the cathode of the first SCR and the second interface pad.

18. The interface of claim 14, further comprising a first field-effect transistor (FET) electrically connected between the anode of the first SCR and the first interface pad, and a second FET electrically connected between the cathode of the first SCR and the second interface pad.

19. The interface of claim 14, wherein the first interface pad comprises a power supply rail and the second interface pad comprises a ground rail.

20. The interface of claim 14, wherein the control circuit further comprises an overshoot protection circuit electrically connected between the first interface pad and the second interface pad, wherein the detection circuit is further configured to limit voltage overshoot by activating a secondary discharge path through the overshoot protection circuit before activating a primary discharge path through the second SCR.

* * * * *